(12) United States Patent
Jaite et al.

(10) Patent No.: US 8,368,415 B2
(45) Date of Patent: Feb. 5, 2013

(54) MULTI-POSITION PROBE CIRCUIT TESTER

(75) Inventors: Thomas J. Jaite, Willoughby Hills, OH (US); Alexander Shaland, Lyndhurst, OH (US); Christopher D. Labedz, Streetsboro, OH (US)

(73) Assignee: SPX Corporation, Charlotte, NC (US)

( * ) Notice: Subject to any disclaimer, the term of this patent is extended or adjusted under 35 U.S.C. 154(b) by 109 days.

(21) Appl. No.: 12/389,682

(22) Filed: Feb. 20, 2009

(65) Prior Publication Data

US 2010/0213961 A1    Aug. 26, 2010

(51) Int. Cl.
*G01R 31/02* (2006.01)
*G01R 31/20* (2006.01)
(52) U.S. Cl. .................... 324/754.02; 324/72.5
(58) Field of Classification Search .................. 324/72.5
See application file for complete search history.

(56) References Cited

U.S. PATENT DOCUMENTS

| | | | | |
|---|---|---|---|---|
| 4,540,940 A * | 9/1985 | Nolan | ............................. | 324/133 |
| 5,581,175 A * | 12/1996 | Yoneyama et al. | ........... | 324/115 |
| 5,672,964 A * | 9/1997 | Vinci | ............................. | 324/72.5 |
| 6,369,592 B1 * | 4/2002 | Majka et al. | ............. | 324/754.14 |
| 6,433,530 B1 * | 8/2002 | Pool | ............................... | 324/72.5 |
| 7,683,629 B2 * | 3/2010 | Kurtz | ............................. | 324/543 |

* cited by examiner

*Primary Examiner* — Roberto Velez
(74) *Attorney, Agent, or Firm* — Baker & Hostetler LLP

(57) ABSTRACT

A circuit tester having a multi-position probe is provided. The circuit tester includes a handle with a detent assembly that allows for positioning the probe at various angles for testing a device. Once a good connection is made with the device under test, an indicator such as a light is lit or a sound is emanated. The probe may be folded into a compartment within the handle once the testing is completed.

16 Claims, 3 Drawing Sheets

MULTI-POSITION PROBE CIRCUIT TESTER

FIELD OF THE INVENTION

The present invention relates generally to a probe circuit tester. More particularly, the present invention relates to multi-position probe circuit tester for use to test circuits in a vehicle.

BACKGROUND OF THE INVENTION

Circuit testers are used to diagnose electrical problems. A circuit tester can be used to test various voltage systems, such as 6V, 12V, 24V, and others. The circuit tester can be used to detect power, ground, shorts and breaks. The circuit tester will indicate via a light when a good connection is detected in a device or circuit under test.

Circuit testers typically include a metal probe being permanently attached to a handle in a fixed straight configuration, similar to a screw driver. Another typical design can include a gun configuration wherein the metal probe is at a relatively perpendicular angle to the handle. The circuit testers can include one or two probes. One probe, for example, can be used to touch a live wire and the second probe, for example, can be used to touch a ground wire.

The circuit testers need a good connection in order to work properly. However, the circuits under test may be at various angles that may not be reachable via a straight or gun configuration. Therefore, there is a need for a circuit tester with a probe that can be angled at various positions in order to make a good connection with a circuit under test regardless of the angle of the circuit under test and the circuit tester.

SUMMARY OF THE INVENTION

The foregoing needs are met, to a great extent, by the present invention, wherein in one aspect an apparatus is provided that in some embodiments includes circuit tester having a probe that can be positioned at various angles.

In accordance with one embodiment, a circuit tester for testing an electrical connection can include a handle having a first end and a second end, a probe detachably coupled to the handle's first end, a wire having a first end and second end, wherein the wire's first end is coupled to the handle's second end, an interchangeable connector detachably coupled to the circuit tester, an indicator that indicates a good electrical connection during a test and located in the handle, and a detent assembly located at the handle's first end and coupled to the probe, wherein the detent assembly allows for the probe to be positioned along an axis of the handle and not along an axis of the handle.

In another embodiment of the invention, a probe tester for testing an electrical connection can include a means for handling having a first end and a second end, a means for probing detachably coupled to the handle's first end, a wire means having a first end and second end, wherein the wire mean's first end is coupled to the means for handling's second end, an interchangeable means for connecting detachably coupled to the circuit tester, a means for indicating that indicates a good electrical connection during a test and located in the means for handling, and a means for detenting assembly located at the means for handling's first end and coupled to the means for probing, wherein the means for detenting allows for the means for probing to be positioned along an axis of the means for handling and not along an axis of the means for handling.

In still another embodiment of the invention, a method of positioning a probe of a circuit tester can include the steps of placing an interchangeable connector at a first location to make a first connection on a device under test, adjusting a probe to a first position relative to the circuit tester's handle, placing the probe at a second location to make a second connection on the device under test, and indicating with an indicator if a good electrical connection is made between the first and the second connection.

In yet another embodiment of the invention, a method of positioning a probe of a circuit tester can include the steps of placing an interchangeable connector at a first location to make a first connection on a device under test, adjusting a probe to a first position relative to the circuit tester's handle, placing the probe at a second location to make a second connection on the device under test, and indicating with an indicator if a good connection is made between the first and the second connections and if a voltage is present.

There has thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

DETAILED DESCRIPTION

Figure 1A:
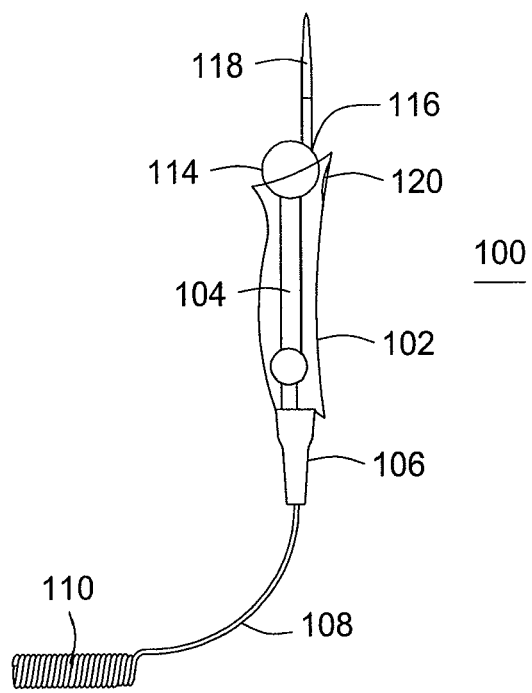
FIGS. 1A-1C are side views of probe circuit tester in various positions according to an embodiment of the invention.

The invention will now be described with reference to the drawing figures, in which like reference numerals refer to like parts throughout. An embodiment in accordance with the present invention provides a multi-position probe tester capable of having the probe at various angles in relation to a handle portion.

FIG. 1A is a side view of probe circuit tester 100 according to an embodiment of the invention. The tester 100 can be used to test circuits in a variety of device such as a battery, relay circuits in a vehicle or any other electrical related devices. The tester 100 can be, for example, voltmeter probe, oscilloscope probes and temperature probes.

The tester 100 includes a handle portion 102 for gripping by a user. The handle portion 102 is molded with a comfort grip rubber which improves gripping during use and provides an aesthetic appearance. The handle portion 102 can be made from any elastomeric material or plastic including cellulose acetate. The handle can include a compartment to receive the probe in a folded position when the test is completed.

The handle portion can be clear so that a light therein can be seen or can be opaque in nature. The handle portion 102 also contains an indicator portion 104 to indicate when there is a good connection during testing. The indicator can be a light, sound, vibration or any other types that can be sensed by the user. The light can be steady, flashing, dim and then bright or vice versa, and any other combination. The sound can be any sound including ring tones, mp3, beeps, and the like. The vibration can vibrate once, continuously, or multiple vibrations at constant or variable frequency. Once a good connection is determined by the tester, as discussed below, the indicator is activated.

Figure 2A:
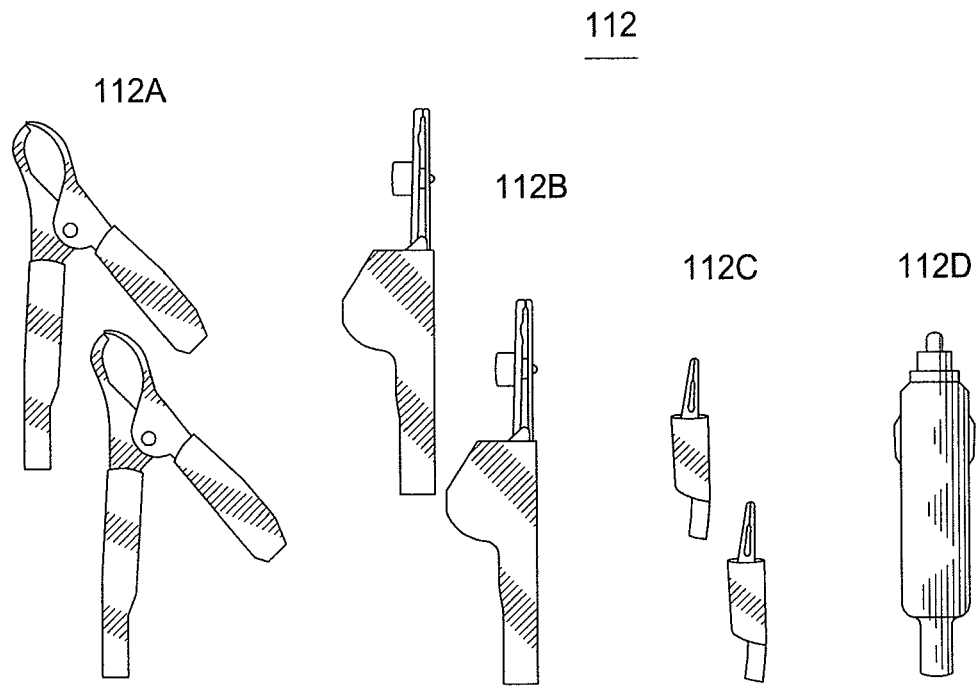
FIG. 2A illustrates the various interchangeable connectors according to the various embodiments of the invention.

At a first end of the handle portion 102 is a wire connection portion 106 through which the handle 102 is coupled to a wire 108 at the wire's first end. The wire connection portion 106 can be constructed and designed so as not to twist or fray during use and to be detachable from the handle portion 102. The wire connection portion 106 can bend to various angles in relation to the handle portion 102 so that the wire 108 can bend as needed during use. The wire 108 has a middle portion 110 that is coiled so that the wire 108 can stretch to temporarily lengthen the wire or return to a shortened coiled state. The wire 108 can be lengthened and shortened as needed. The wire's second end includes an interchangeable connector 112 (FIG. 2A).

The interchangeable connector 112 can include clips, such as battery clips and alligator clips or tips, such as 3 in 1 tips. Alternatively, a cigarette adaptor can be attached to the wire's second end. In another embodiment, the interchangeable connector 112 can be directly attached to the wire connection portion 106 or to wire 108. Connector 112 provides one connection for the tester to a device under test. It should be noted that any type of connector can be used herein and that the tips and clips are but only examples.

At a second end of the handle 102 is a detent assembly 114 that includes a probe connector 116, a detent and a button 120. The probe connector is constructed and designed to connect a probe 118 thereto. Examples of the probe can include a standard probe, an extended reach probe, a piercing probe, and a precision probe. However, any type of probe can be used and connected with the tester. In one embodiment, the probe can be a stainless steel that can include a insulated sheath.

Figure 1B:
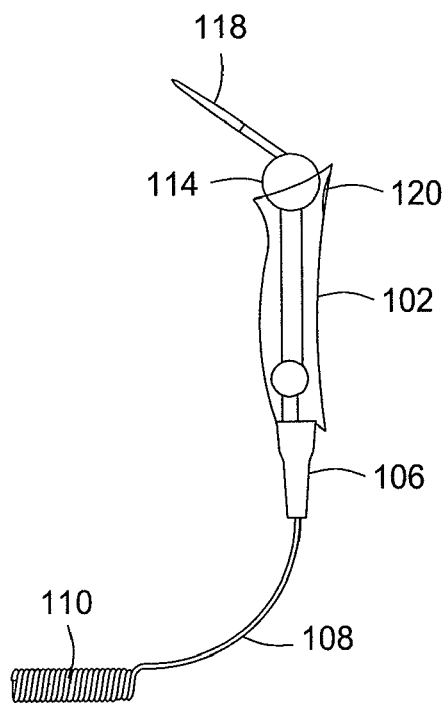
Figure 1C:
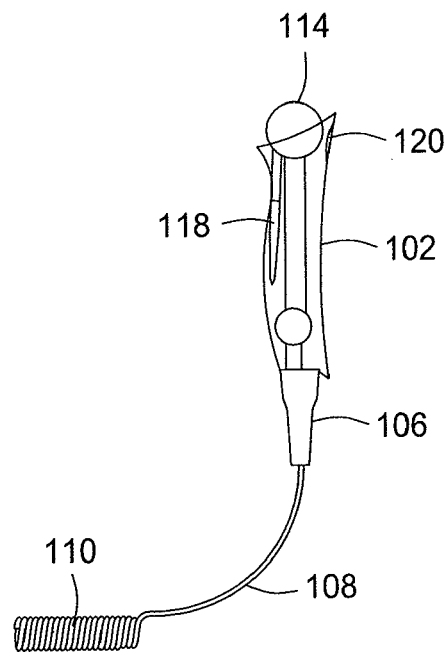

The detent assembly is designed so that the probe 118 can be temporarily fixed a certain angle relative to an axis of the handle 102, as shown in FIGS. 1A, 1B and 1C. FIG. 1A illustrates the probe 118 being on the same axis as the handle 102. By pressing on the button 120, the probe can be moved into a second position, as shown in FIG. 1B. In this second position, the probe 118 is positioned to be in any angle between the first position and a third position (as shown in FIG. 1C). FIG. 1C illustrates the probe in a third or closed position that is on the same axis as the handle 102.

FIGS. 1A-1C illustrate the various positions that the probe may be placed in order to function best for the user. In one embodiment shown in FIG. 1A, the probe is in a straight position. In this embodiment, the probe is along the same axis as the handle's axis.

In another embodiment shown in FIG. 1B, the probe is in angled position relative to the handle's axis. This allows the probe to be placed at various angles depending on the need of the user and to access hard to reach areas. In still another embodiment shown in FIG. 1C, the probe is in a closed position so that the probe can be stored away when the tester is not in use. In the closed position, the probe can be received within the handle so that only a portion of the probe is exposed or can be received entirely within the handle so that the probe is not damaged during transport or storage. The benefits of the closed position include safety during transporting and storage and for compactness during storage. Other benefits will be obvious to the user.

The embodiments of the invention allow the probe to be positioned at any position between the positions shown in FIG. 1A to FIG. 1C.

FIG. 2A illustrates the various interchangeable connectors 112 such as battery clips 112A, 3 in 1 clips 112B, alligator clips 112C and cigarette adapter 112D. The interchangeable connectors 112 are interchangeable depending on the needs of the user and the device under test. They can be mated to the wire 108 or to the handle portion.

Figure 2B:
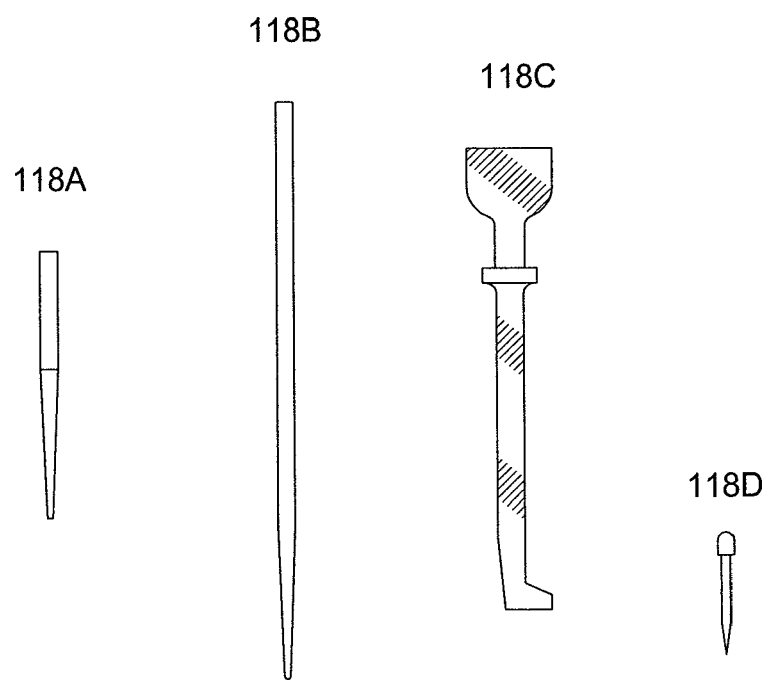
FIG. 2B illustrates the various probes according to the various embodiments of the invention

FIG. 2B illustrates the various probes 118 that can be used in the various embodiments of the invention. The probes 118 can include a standard probe 115A, an extended reach probe 118B, a piercing probe 118C, or a precision probe 118D. However, any probe of any size or configuration can be used.

Figure 3:
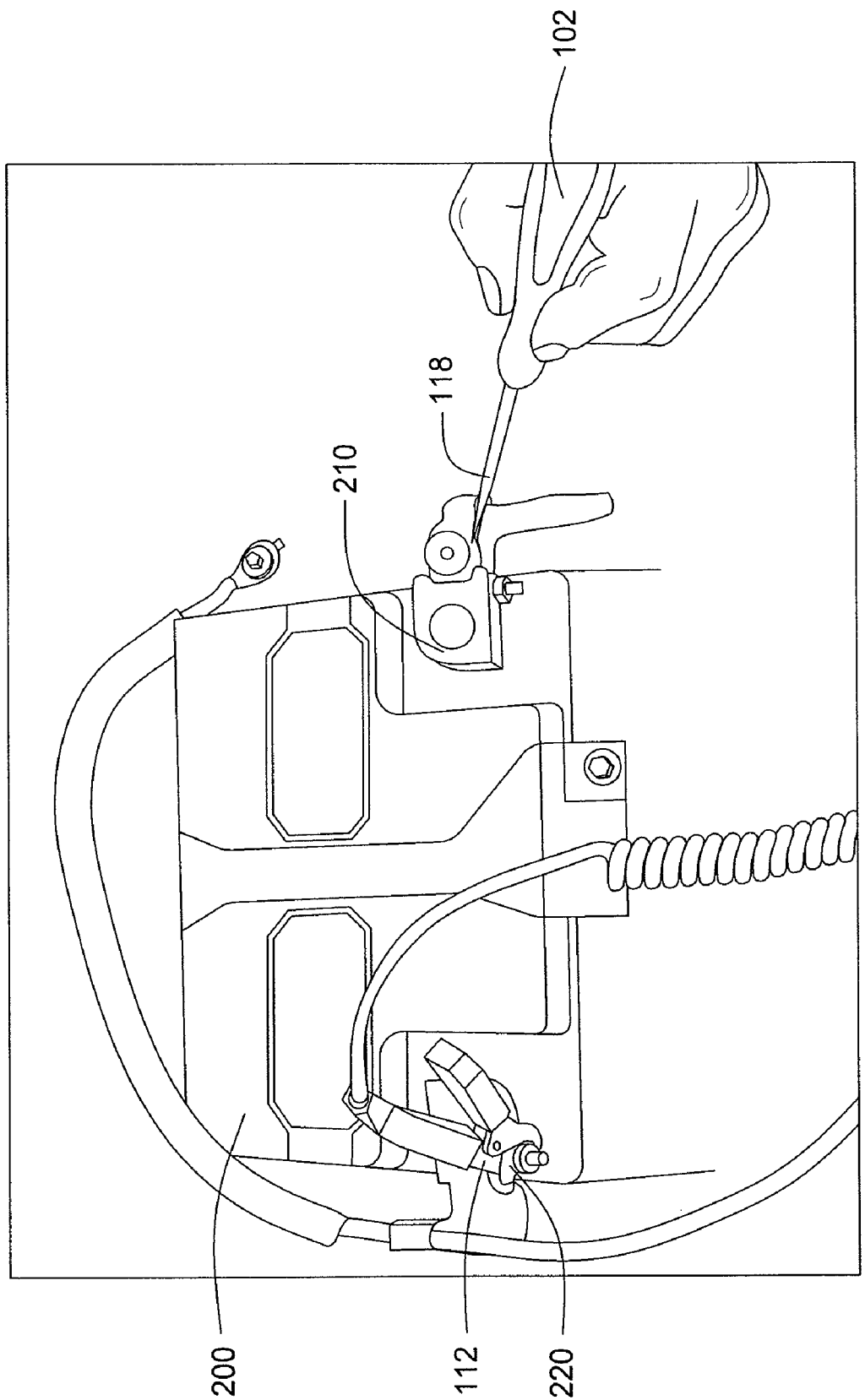
FIG. 3 illustrates the probe tester in use to test a battery connection.

FIG. 3 illustrates the probe tester in use to test a battery 200 connection. The battery 200 includes positive post 210 and a negative post 220. The interchangeable connector 112, in this case is a plier-type clip, can be placed at the negative post 220 while the user grips the handle 102 having the probe 118. With the handle 102, the user can place the probe 118 in contact with positive post 210 to make an electrical connection. If an electrical connection is made, then the indicator will indicate a good connection.

In an alternative embodiment, when a good connection is established between both ends of the circuit tester and the circuit, the indicator will indicate if a voltage is present in the circuit. For example, a continuity tester's (a circuit tester with a 1.5V battery inside) indicator will indicate if the circuit under test is complete.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A circuit tester for testing an electrical connection, comprising:
   a handle having a first end and a second end;
   a probe detachably coupled to the handle's first end, the probe pivotally attached to the tester to allow the probe to rotate from a position in the handle to an extended position;
   a wire having a first end and second end, wherein the wire's first end is coupled to the handle's second end;
   an interchangeable connector detachably coupled to the circuit tester;
   an indicator that indicates a good electrical connection during a test and located in the handle; and a detent assembly located at the handle's first end and coupled to the probe, wherein the detent assembly allows for the probe to be selectively positioned to a position parallel to a longitudinal axis extending through a longest length of the handle and a position where the probe is not parallel to the longitudinal axis extending through the longest length of the handle.

2. The tester of claim 1, wherein the interchangeable connector is detachably coupled to the circuit tester at the wire's second end.

3. The tester of claim 1, wherein the interchangeable connector is detachably coupled to the circuit tester at the handle's second end.

4. The tester of claim 1, wherein the probe may be positioned flush within a compartment of the handle to prevent damage during storage or transport.

5. The tester of claim 1, wherein the detent assembly includes a button that when depressed allows for the probe to be placed in various positions relative to the handle's axis.

6. The tester of claim 1, wherein the indicator is a light source.

7. The tester of claim 1, wherein the indicator is a sound source.

8. The tester of claim 1, wherein the handle is made of a material that allows light to penetrate from an inside of the handle to an outside of the handle.

9. A circuit tester for testing an electrical connection, comprising: a means for handling having a first end and a second end; a means for probing detachably coupled to the handle's first end, the means for probing pivotally attached to the tester to allow the probe to rotate from a position in the handle to an extended position; a wire means having a first end and second end, wherein the wire mean's first end is coupled to the means for handling's second end; an interchangeable means for connecting detachably coupled to the circuit tester; a means for indicating that indicates a good electrical connection during a test and located in the means for handling; and means for detenting located at the handle's first end and coupled to the means for probing, wherein the means for detenting allows for the means for probing to be selectively positioned to a position parallel to a longitudinal axis extending through the longest length of the means for handling and a position where the means for probing is not parallel to the longitudinal axis extending through the longest length of the means for probing.

10. The tester of claim 9, wherein the interchangeable means for connecting is detachably coupled to the circuit tester at the wire means' second end.

11. The tester of claim 9, wherein the interchangeable means for connecting is detachably coupled to the circuit tester at the means for handling's second end.

12. The tester of claim 9, wherein the means for probing may be positioned flush within a compartment of the means for handling to prevent damage during storage or transport.

13. The tester of claim 9, wherein the means for detenting includes a button that when depressed allows for the means for probing to be placed in various positions relative to the means for handling's axis.

14. The tester of claim 9, wherein the means for indicating is a light source.

15. The tester of claim 9, where in the means for indicating is a sound source.

16. The tester of claim 9, wherein the means for handling is made of a material that allows light to penetrate from an inside of the means for handling to an outside of the means for handling.

* * * * *